STRUCTURALLY INTEGRATED FILM RESISTOR ASSEMBLY

Filed May 26, 1960 2 Sheets-Sheet 1

INVENTOR.
ROSS A. QUINN
BY
George C. Sullivan
Agent

INVENTOR.
ROSS A. QUINN
BY
George A. Sullivan
Agent 2,994,846

STRUCTURALLY INTEGRATED FILM RESISTOR ASSEMBLY

Ross A. Quinn, Palo Alto, Calif., assignor to Lockheed Aircraft Corporation, Burbank, Calif.
Filed May 26, 1960, Ser. No. 31,946
4 Claims. (Cl. 338—308)

This invention generally relates to electronic resistor components and more particularly, to a structurally integrated film resistor assembly and the fabrication thereof.

With the increasing attention now being given to the microminiaturization of electronic circuitry because of military and space requirements, the development of highly stable and more efficiently constructed miniaturized electronic components and assemblies has taken on new importance. However, considerable problems have arisen, such as the difficulty of obtaining components which remain stable up to the high temperatures of operation necessary in many military and space applications. Also, although miniaturized electronic components have been fabricated in some cases, the interconnection therebetween has remained a considerable problem.

The present invention is concerned primarily with resistor components and assemblies, and its broad object is to provide improved constructions and fabrication techniques for resistor components and assemblies.

A more specific object of this invention is to provide structurally integrated film resistor components and assemblies which are stable at very high temperatures of operation.

Another object of this invention is to provide a structurally integrated film resistor assembly which permits more efficient use of a given volume.

Still another object of this invention is to provide a structurally integrated film resistor assembly which requires no soldered interconnections between the individual resistor components of the assembly.

A further object of this invention is to provide a method for fabricating a structurally integrated film resistor component or assembly of components which is relatively inexpensive and lends itself to mass production techniques.

In a typical embodiment of the invention the above objects are realized by forming each resistor component as a high resistivity titanium oxide film on the inner surface of a hole provided in a suitable substrate, the tubular film resistor components so formed being interconnected by means of a low resistivity titanium wiring pattern etched on opposite sides of the substrate. Also, one or more other types of electronic components, such as diodes or capacitors may be contained in the empty portions of the resistor component holes and suitably soldered to the wiring pattern in order to achieve a high component density.

The specific nature of the invention as well as other advantages, uses and objects thereof will clearly appear from the accompanying description and drawing in which:

FIGS. 1–6 illustrate various steps in the fabrication of a structurally integrated tubular film resistor component in a hole in a portion of a substrate, in accordance with the invention.

FIGS. 2, 4, 6 and 8 are cross sectional front views of top views 1, 3, 5 and 7, respectively, taken along the lines indicated.

Like numerals designate like elements throughout the figures of the drawing.

FIGS. 1–8 illustrate typical steps for fabricating a structurally integrated tubular film resistor component in a hole 22 in a portion of an insulative substrate 20. The substrate 20 may be any of a variety of suitable materials such as fused silica, quartz, glass, alumina and magnesium oxide. Although FIGS. 1–8 illustrate the fabrication of only a single resistor component, it is to be understood that any desired number of components can be simultaneously formed in the substrate 20 to provide any desired predetermined resistor assembly.

Figures 3, 4:
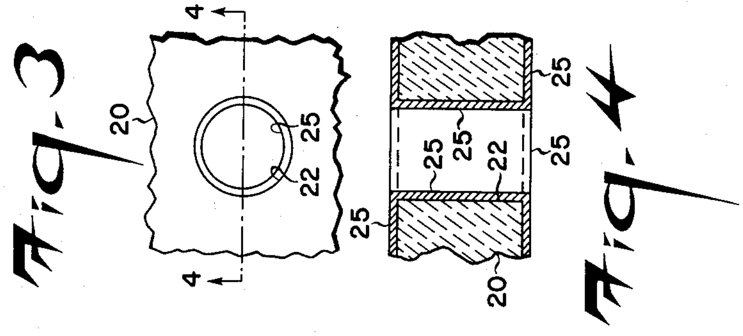
Figures 1, 2:
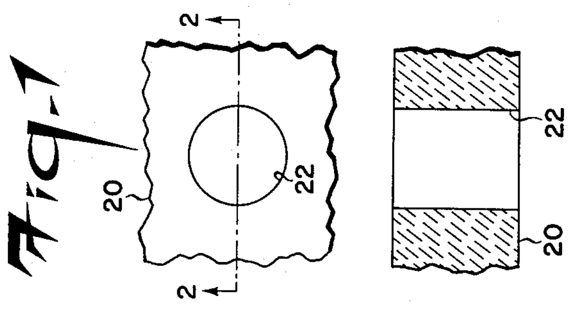

As shown in FIGS. 1 and 2 a hole 22 is bored through the substrate 20 for each resistor component to be provided, the diameter of the hole 22 being chosen in accordance with the value of resistance desired, as will hereinafter become evident. A thin titanium film 25 is now coated on the surfaces of the substrate 20, including the inner surface of each hole 22 as shown in FIGS. 3 and 4. This may be accomplished by a method such as is disclosed in U.S. Patent No. 2,746,888. However, I prefer to use the sandwich method disclosed in my copending patent applications Serial Numbers 8,157 and 8,481, both filed on February 11, 1960. The thickness of the film 25 in the drawings is exaggerated for illustrative purposes.

Figures 5, 6:
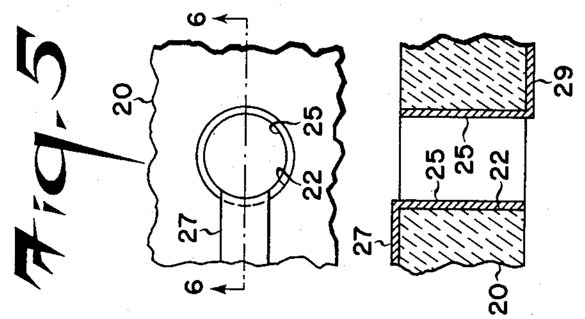

The flat faces of the titanium coated substrate are now etched using well known etchants and paint resists to provide any desired titanium wiring patterns thereon, such as might be required for interconnecting the resistor components in a desired manner. In FIGS. 5 and 6, the titanium film leads 27 and 29 provided in contact with opposite ends of the titanium-coated hole 22 indicate the portions of the etched wiring pattern corresponding to one resistor component. Between these titanium film leads 27 and 29 appears the resistance between opposite ends of the tubular titanium film 25 coated on the hole 22. Since the resistivity of titanium is quite small, the resistance between the film leads 27 and 29 for the structure of FIGS. 5 and 6 is also quite small.

In order to provide a useable value of resistance, the tubular titanium film 25 coated in the hole 22 is now converted into a film of high resistivity. A method which has been found well suited for accomplishing this conversion is disclosed in my copending patent application Serial Number 8,480 filed February 11, 1960. The method disclosed in this copending patent application involves converting a titanium film into a high resistivity film by simultaneously anodizing and etching the film in a bath essentially consisting of an anodizing electrolyte and etching material capable of etching the metal oxide formed on the titanium film as a result of anodization thereof. The concentration of etching material in the bath is chosen so that the surface of the film is converted into oxide by anodization before being attacked by the etching material, the time of simultaneous anodizing and etching of the film in the bath determining the resultant resistivity thereof.

It has been discovered that this simultaneous anodizing and etching treatment achieves an amazingly uniform and more controlled reduction in the film than could be obtained by any known etching process, thereby making it possible to obtain very thin films of high resistivity and stability. An additional advantage which is also derived is that the resistivity of the film increases not only because of the reduction in its thickness, but also, because when the film becomes very thin the anodization process will have converted a significant thickness of the film into a high resistance metal oxide.

In a preferred embodiment of this simultaneous anodizing and etching technique, a two-bath treatment is provided in which the first bath performs the simultaneous anodizing and etching of the film as described above until an intermediate resistivity is obtained; then the final value of resistivity is obtained in a true anodizing bath without any etching material. This second bath is chosen so that the anodizing process penetrates to a greater depth than did the anodizing process of the first bath, thereby causing a greater portion of the film to be converted into oxide to increase the film resistivity. Using this greater depth of anodizing in the second bath without etching permits greater uniformity and more control of the final resistivity obtained without further thinning of the film and, in addition, permits a higher resistivity to be obtained for a greater film thickness, since more of the film is converted into a high resistance oxide.

The following specific example will now clearly illustrate the two-bath conversion technique for converting a metal film into one of high resistivity disclosed in the previously mentioned copending patent application. First, a suitable substrate, such as alumina, is coated with a titanium film of convenient thickness with a resistivity of the order of 0.2 to 15 ohms per square, and a suitable electrical lead wire is connected thereto.

The substrate is then immersed in a first bath consisting of 1 gram of sodium fluoride NaF in 200 milliliters of a 5% sulfuric acid $H_2SO_4$ solution for a time of approximately ten minutes with an anodizing current flow starting at 40 milliamperes per square centimeter and then decreasing, and a voltage source adjustable up to 100 volts.

When the resistivity of the film reaches the order of 80 to 200 ohms per square, the substrate is removed from the first bath and immersed in a second bath consisting of a saturated sodium perborate $NaBO_3$ solution. The anodizing current flow starts at 8 milliamperes per square centimeter and a voltage source is provided adjustable up to 250 volts. The substrate is held immersed in the second bath until the resistivity of the film increases to the desired value.

Using the two-bath procedure of the aforementioned copending application described above, highly stable films having resistivities as high as 5,000 ohms per square have been successfully produced.

Figures 7, 8:
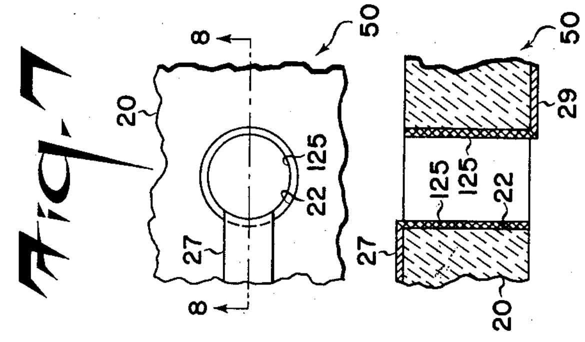

Before subjecting the structure of FIGS. 5 and 6 to the simultaneous anodizing and etching treatment described above, the film leads 27 and 29 are protected from the treatment with a suitable paint or epoxy resist. After the treatment, therefore, the titanium film 25 on the interior of the hole 22 in the structure of FIGS. 5 and 6 will be converted to a film of high resistivity, the resulting film resistor component 50 obtained being shown in FIGS. 7 and 8. The converted high resistivity film 125 is indicated in FIG. 8 by double cross-hatching. The unchanged low resistivity titanium film leads 27 and 29 are shown in FIGS. 7 and 8 with the protective paint or epoxy resist which was provided during the conversion treatment removed.

Figure 9:
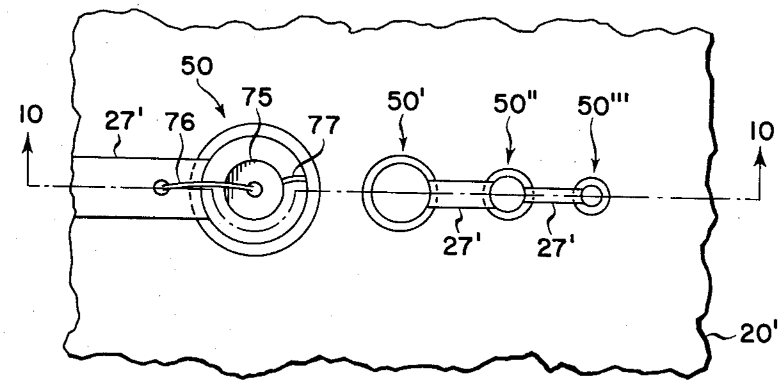
FIG. 9 is a top view of an embodiment of a structurally integrated film resistor assembly in accordance with the invention.
Figure 10:
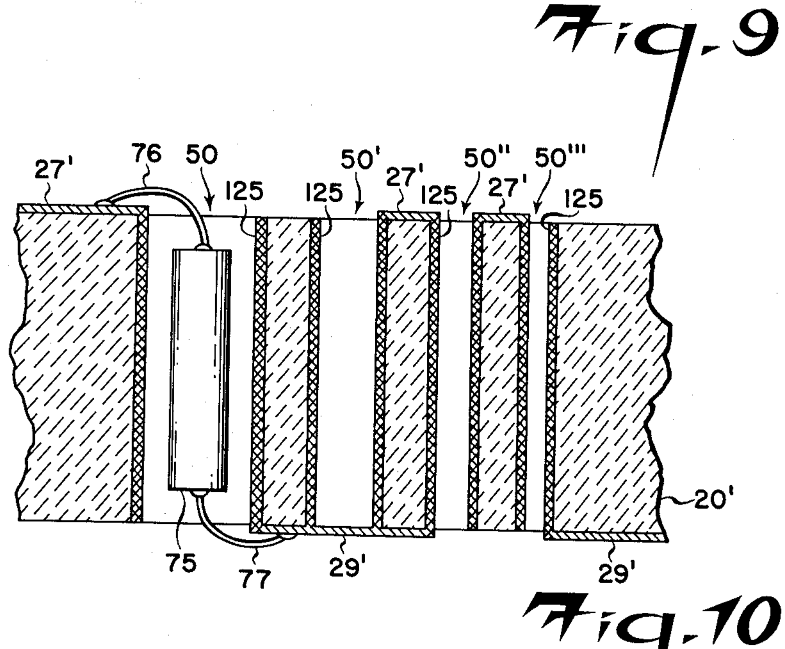
FIG. 10 is a cross sectional front view of FIG. 9 taken along the lines 10—10.

FIGS. 9 and 10 are respectively top and cross-sectional front views of an embodiment of a four resistor assembly comprising the tubular film resistor components 50, 50', 50'' and 50''' which may be simultaneously fabricated in the substrate 20' as just described. The titanium film interconnection pattern on the top face of the substrate 20' is indicated at 27' and on the bottom face as 29'. As in FIG. 8, the double cross-hatched films 125 correspond to the converted high resistivity films while the single cross-hatched films 27' and 29' correspond to unconverted low resistivity titanium films.

If desired a component may be contained in any or all of the empty holes of the tubular film resistor components in order to achieve a high component density, such as is illustrated by a diode 75 in the hole of the resistor component 50 with the diode lead wires 76 and 77 respectively connected to the titanium film interconnection patterns 27' and 29' as shown in FIGS. 9 and 10.

Figure 11:
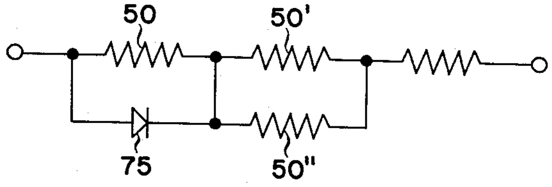
FIG. 11 is an equivalent electrical circuit diagram of the embodiment of FIGS. 9 and 10.

In the assembly of FIGS. 9 and 10 the resistors are shown as being all in one line. This has been done merely for illustrative convenience, and it will be realized that any other desired arrangement of resistor components could be employed. Also, it will be realized that any desired interconnection pattern between resistor components is readily provided by etching the desired interconnection patterns 27' and 29'. FIG. 11 shows the electrical circuit diagram for the particular illustrative interconnection patterns 27' and 29' shown in FIGS. 9 and 10.

The determination of the resistance value of each tubular film resistor component in an assembly such as shown in FIGS. 9 and 10 will become evident from the following considerations.

First, as a result of the simultaneous fabrication treatment of the resistor components previously described, it will be realized that the resistivity of the high resistivity films 125 will be the same for all holes regardless of their diameter. Thus, it can mathematically be shown that the resistance R of any resistor component may be written as:

$$R=\frac{\rho L}{\pi d}$$

where $\rho$ is the resistivity in ohms per square of the converted films 125, L is the thickness of the substrate 20' (that is, the length of the hole) and $d$ is the diameter of the originally bored hole 22 in FIGS. 1–8. The above equation assumes that the thickness of the high resistivity film is very much smaller than the diameter $d$, which is usually the case.

The relative values of the resistor components 50, 50', 50'' and 50''' may thus be chosen by appropriately choosing their diameters $d$ in proper relation to one another. The conversion treatment which produces the resultant film resistivity $\rho$ is then employed to provide the resistivity which will give the desired absolute values to the resistor components. For example, if the resistor components 50, 50', 50'' and 50''' have original hole diameters $d$ equal to .080, .040, .016 and .008 inch, respectively, the resistivity $\rho$ is made equal to 1,000 ohms per square and the length L of the substrate is equal to .25 inch, then the resistor components will have substantially the following resistance values:

| | Ohms |
|---|---|
| Resistor component **50** | 1,000 |
| Resistor component **50'** | 2,000 |
| Resistor component **50''** | 5,000 |
| Resistor component **50'''** | 10,000 |

In the embodiments and methods described herein, it will be noted that titanium has been used as the basic material from which the resultant structurally integrated assembly is fabricated. It is to be understood that the invention is not limited to the use of titanium or to the specific arrangements and techniques described herein. Other materials and other techniques and arrangements could also be employed by means of which a high resistivity film can be provided on the interior surfaces of one or more holes in a substrate with interconnection patterns therebetween.

However, the use of titanium as described is advantageous in that it is stable at very high temperatures and the conversion treatment for obtaining a high resistivity film therefrom disclosed in my copending patent application Serial Number 8,480 results in stable films of high resistivity. This conversion treatment may also be successfully employed with zirconium, hafnium and uranium as well as titanium.

The above modifications and variations indicated above are not exhaustive and the invention is to be considered as including all possible modifications and variations in the construction, arrangement and fabrication procedure coming within the scope of the invention as defined in the appended claims.

I claim as my invention:

1. An assembly of discrete film resistors comprising an insulative substrate having a plurality of holes therein, each hole corresponding to one of said film resistors and having a thin layer of anodized metal of a class consisting of titanium, zirconium, and hafnium on the inner surface thereof forming a resistive film, and a wiring pattern formed on at least one face of said substrate for electrically interconnecting the resistive films in said holes in a predetermined manner, the resistivity of the resistive films in said holes being very much greater than the resistivity of said wiring pattern.

2. An assembly of discrete film resistors comprising an insulative substrate having a plurality of holes therein, each hole corresponding to one of said film resistors and having a thin layer of anodized titanium on the inner surface thereof forming a resistive film, and an etched wiring pattern formed on at least one face of said substrate electrically interconnecting the resistive films in said holes in a predetermined manner, the resistivity of the resistive films in said holes being very much greater than the resistivity of said wiring pattern.

3. The invention in accordance with claim 2, wherein at least one electronic component is disposed in at least one of said holes having lead wires electrically connected to said wiring pattern.

4. The invention in accordance with claim 2 wherein etched wiring patterns are formed on both sides of said substrate.

References Cited in the file of this patent

UNITED STATES PATENTS

| | | |
|---|---|---|
| 2,338,531 | Naumann et al. | Jan. 4, 1944 |
| 2,443,018 | Arvin et al. | June 8, 1948 |
| 2,589,983 | Blodgett et al. | Mar. 18, 1952 |
| 2,693,023 | Kerridge et al. | Nov. 2, 1954 |
| 2,827,536 | Moore et al. | Mar. 18, 1958 |